United States Patent [19]

Chandross et al.

[11] 4,187,111
[45] Feb. 5, 1980

[54] SENSITIZED POROUS BODIES USEFUL FOR PRODUCING THICK REFRACTIVE INDEX RECORDINGS

[75] Inventors: Edwin A. Chandross, Berkeley Heights; Walter J. Tomlinson, III, Holmdel, both of N.J.

[73] Assignee: Bell Telephone Laboratories, Incorporated, Murray Hill, N.J.

[21] Appl. No.: 902,361

[22] Filed: May 3, 1978

Related U.S. Application Data

[62] Division of Ser. No. 801,783, May 31, 1977.

[51] Int. Cl.$^2$ ............................ G03C 1/72; G03C 5/04
[52] U.S. Cl. ........................................ 430/2; 430/1; 430/290
[58] Field of Search ............... 96/67, 79, 27 R, 27 E, 96/27 H, 35.1, 38.3, 115 R, 115 P; 350/3.5

[56] References Cited

U.S. PATENT DOCUMENTS

| | | | |
|---|---|---|---|
| 3,661,584 | 5/1972 | Van Den Heuvel et al. | 96/67 |
| 3,779,775 | 12/1973 | Chiba et al. | 96/67 X |
| 3,864,130 | 2/1975 | Nassenstein et al. | 96/38.3 |
| 3,888,672 | 6/1975 | Lee | 96/35.1 |
| 3,993,489 | 11/1976 | Heimsch | 96/77 |
| 4,069,049 | 1/1978 | Reich et al. | 96/27 H |
| 4,081,276 | 3/1978 | Crivello | 96/35.1 |

*Primary Examiner*—Edward C. Kimlin
*Attorney, Agent, or Firm*—Bruce S. Schneider

[57] ABSTRACT

A latent-imaging photopolymer system for recording thick refractive index patterns is disclosed. The system utilizes a porous matrix which has been sensitized by chemisorption of a photosensitive polymerization initiator. The sensitized matrix is exposed to light in the desired pattern. This light destroys initiator to impress the pattern. Then the pores are filled with a monomer composition. Finally the entire filled matrix is irradiated to induce polymerization initiation by the sensitizer remaining after the initial exposure. Polymerization produces locally induced refractive index gradients corresponding to the pattern of the light in the initial exposure step.

4 Claims, No Drawings

SENSITIZED POROUS BODIES USEFUL FOR PRODUCING THICK REFRACTIVE INDEX RECORDINGS

This is a division of application Ser. No. 801,783, filed May 31, 1977.

BACKGROUND OF THE INVENTION

1. Field of the Invention

This invention relates to thick phase holograms and more particularly to latent-image methods of their production.

2. Background

Thick refractive index patern recordings (approximately 10 $\mu$m to 10 mm thick) are considered a potentially attractive medium for efficient image reconstruction or conversion. A contemplated procedure for fabricating thick phase patterns involves first recording the pattern as a latent image of relatively small changes in refractive index and then developing the recorded image to produce the needed much larger refractive index changes. Such a latent image procedure is particularly desirable for making high efficiency recordings. If a substantial fraction of the image develops during the recording or exposure step, this much larger refractive index modulation can introduce significant scattering, and hence distortion, of the recording beams. Thus, noticeable distortions of the final image can occur.

Various approaches have been taken to produce latent-image thick phase recordings, e.g., exposure of dichromated gelatin or a photographic film followed by processing with respectively isopropyl alcohol or a bleaching agent. (See Meyerhofer, *RCA Review*, 33, 110 (1972), and Pennington and Harper, *Applied Optics* 9 (7) 1643 (1970).) Presently, latent-image techniques can, indeed, yield high efficiency recordings. Latent imaging, however, usually entails elaborate chemical diffusion procedures to develop the image. These chemical procedures can be inconvenient and can also degrade image quality. For example, to develop a dichromated gelatin or photographic emulsion, chemical solutions must be diffused into the photosensitive substrate to develop the refractive index pattern. The substrate prevents diffusion through thickness greater than a few tens of microns. This is a limitation for applications where thicker records are desirable. Additionally, the development process often causes a change in thickness of the substrate. This change, which may or may not be uniform, in turn produces a corresponding distortion of the final image.

SUMMARY OF THE INVENTION

It has been found that it is possible to use a photosensitized rigid body as a substrate for latent-image recording of a predetermined pattern which is more than a few tens of microns thick. In accordance with the invention, a rigid porous matrix is sensitized with a photosensitive compound which is a polymerization initiator. The substrate is then illuminated with a light pattern corresponding to the desired image. The incident exposing light causes a chemical change in the photosensitive compound. After this photoreaction, the exposed compound is no longer useful as a polymerization initiator. Thus, a negative image is recorded in the substrate by deactivating portions of the photosensitive initiator at points corresponding to the incident light pattern.

The image is then developed by filling the pores of the matrix with a monomer composition whose polymerization is initiated by the photosensitive compound. The photosensitive initiator compound which remains in the rigid body is activated by a uniform application of energy, e.g., light energy, to the matrix. Polymerization occurs most rapidly at sites where more initiator remains. This selective initiation of polymerization throughout the matrix leads to a corresponding modulation of the refractive index of the final polymer. (The polymerization inside the glass matrix, once initiated, is similar to the related photoinduced polymerization of the same types of multicomponent monomer mixtures known to the art; see, for example, Tomlinson et al., Applied Optics, 15 (2), 534 (1976).)

By this process the initial image is stored as a pattern of varying refractive indices in a rigid matrix. Because of the rigid matrix the thickness of the final material remains substantially the same as that of the original medium. Generally, refractive index differences in the $10^{-4}$ range are obtainable. For example, a mixture of dibutyl adipate, benzyl methacrylate and ethylene glycol dimethacrylate yields a refractive index difference of approximately $3.2 \times 10^{-4}$. The efficiency of the recording depends on the geometry of the image and reference exposing beams and is a complicated function of both the refractive index difference and the thickness of the recording. (See Kogelnik, H., *Bell System Technical Journal*, 48 (9), 2909 (1969).) However, scattering efficiencies of approximately 80% in a 1 mm thick transmission grating recorded in the previously mentioned adipate mixture is exemplary of the efficiencies achievable.

DETAILED DESCRIPTION

The invention can best be described by an individual description of the steps and materials used in the production of various embodiments of the inventive refractive index patterns.

1. The Porous Matrix and Photosensitive Compound

The matrix chosen as the superstructure for the ultimate thick-phase pattern must have certain physical and chemical properties. The pores should be small enough to scatter the exposing light only weakly. If the pores are too large, e.g., larger than about 400 angstroms, substantial scattering during exposure is possible, resulting in a distorted image. Excessively small pores e.g., smaller than about 10 angstroms, hinder or prevent diffusion of the liquid into the matrix, and are unacceptable for thick patterns. Preferably, the pores should be in general between 20 and 400 angstroms and most advantageously between 20 and 200 angstroms. Implicit in the discussion of pore size is the requirement of a rigid matrix. If this requirement is not satisfied, unacceptable changes in overall thickness and/or microscopic dimension during processing are possible.

The matrix must also be susceptible to sensitization. It is necessary to strongly bind a photosensitive compound throughout the pores of the matrix. The adhesion of the photosensitive compound onto the walls of the pores should be sufficiently strong to prevent substantial disengagement during any step prior to the completion of the overall exposure stage. It is preferable that the link between the matrix and the photosensitive compound be a chemical bond, i.e., chemisorption. The existence of a strong bond helps prevent the unexposed bound initiator compound from migrating and thus degrading the inherent efficiency obtainable. Further, if a solvent is used to fill the pores during exposure (which is most desirable) or if a solvent is used to remove residues of the irradiated chemisorbed compound after exposure, the bond must be strong enough to prevent total solvation and the resulting migration of the photosensitive compound. (The requirement on bond strength in turn relates to the fluids used after the incorporation of the photosensitive compound.)

The strength of the bond between the matrix and the photosensitive compound certainly depends on the choice of both entities. A combination should be picked which has the requisite bond characteristics. The photosensitive compound must also possess certain photochemical properties. First, the compound must be capable of initiating a polymerization reaction when irradiated by some form of energy, e.g., light. An example of such a compound is a free radical former such as benzoin. Second, the compound must undergo a photochemical reaction which permanently destroys or strongly reduces its ability to serve as a photoinitiator. For example, it has been found that a free radical former in the absence of a monomer composition, upon irradiation with light of a particular wavelength permanently loses its photoinitiator properties. (It should be noted that at the initiator concentrations typically required for photopolymerization, the photochemical changes induced in the initiator do not normally result in large refractive index differences. If such changes should develop, a different photosensitive compound should be used.)

A consideration of the previously discussed requirements suggests the use of a porous silica glass matrix as a preferred embodiment. Such a matrix is rigid, insoluble in most common solvents, and has a surface containing reactive hydroxyl groups which are used to bind an appropriate photosensitive compound. In this regard VYCOR No. 7930, a porous silica glass made by Corning Glass Works is advantageous. Corning specifications indicate that this glass has an average pore diameter of 40 angstroms (an acceptable size as discussed earlier) and a total pore space of about 28% of its total volume.

The particular reaction used to attach the photosensitive compound to the matrix is not critical. The photosensitive compound is directly attached or the silica surface is first activated for attachment. The process for either method should preferably form only volatile or gaseous by-products. This facilitates removal of reaction by-products which can interfere with the photochemical processes of the invention. When using the latter method, a chlorinating agent such as thionyl chloride is advantageously used to activate the surface of a silica matrix. It is contemplated that the reaction proceeds as follows:

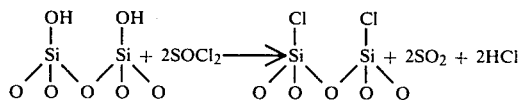

The by-products, sulfur dioxide and hydrogen chloride, are both gases. This treatment results in reactive silicon-chlorine groups on the glass. These sites react with a variety of functional groups. In one embodiment a solution of a photosensitive initiator compound with a hydroxyl group is utilized. It is believed the reaction proceeds as follows:

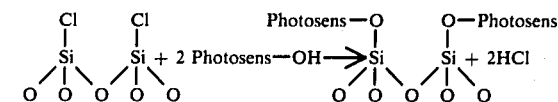

Advantageously the by-product is again volatile and is removed along with the solvent employed in this step by simple evaporation.

The choice of photosensitive initiator is not limited to any particular compound and depends on the monomers to be polymerized in the development step. Obviously, the photosensitive compound must be a suitable polymerization initiator for the monomers. In the preferred embodiment of the invention involving methacrylate monomers, benzoin is employed. Benzoin, a free radical former, is advantageous because of its reactive hydroxyl group for chemisorption, because it chemisorbs to glass without a pretreatment such as with thionyl chloride, and because of its frequent use as a photoinitiator for methacrylate polymerization.

2. Sensitization

The photosensitive material should be evenly distributed throughout the porous matrix. Absolute homogeneity is not essential. However, as the distribution becomes less uniform the distortion in the ultimate image becomes worse. To avoid excessive distortion it is also necessary that the actinic radiation reach essentially all the photosensitive sites. The absorption coefficient of the photosensitive compound (or the fragment left bound to the matrix after the dissociation) and the concentration of that compound determine the amount of light absorbed in a unit volume of the matrix. If the concentration is too great, substantially all the light is absorbed before reaching all the sensitized sites. On the other hand, the concentration of the photosensitive initiator must be great enough to initiate polymerization which is sufficient for image development. This lower limit depends on the monomers used in the development step. Generally, a concentration of between $5 \times 10^{-3}$ and $5 \times 10^{-2}$ moles/liter is a useful concentration range. The precise parameter for each particular photosensitive initiator is determined through a control sample.

A solution of the photosensitive compound is used to impregnate the matrix. Various means of impregnation are possible. For example, the matrix is simply immersed in the solution or the solution is flowed through under pressure. Because a matrix with small pores is desirable, the diffusion time of the solution to the center of the matrix can be substantial. This delay time can result in inhomogeneous distributions of the photosensitive compound in the matrix, when dilute solutions are employed. Further the restrictions on photosensitive compound concentration (discussed earlier) can result in the use of relatively dilute solutions, e.g., on the order of $5 \times 10^{-2}$ molar. If the dilute solution diffuses slowly through the matrix, large concentration gradients are possible. This occurs because much of the photosensitive material present reacts with the active sites contained in the portion of the matrix first contacted.

To alleviate this problem, when it occurs, a non-photosensitive compound which chemisorbs to the matrix and competes with the photosensitizor for the active sites, is added to the solution. In the case of benzoin an aliphatic alcohol, for example, is an appropriate non-photosensitive compound. The additive is chosen to have negligible absorption for the exposing light and therefore does not further limit the concentration of the photosensitive material. With this additive present the concentration gradient of entities which react with the matrix is substantially reduced.

After the matrix is sensitized, any residual entity which can interfere with the polymerization during development should be removed. For example, where the matrix is treated with thionyl chloride and then contacted with benzoin, the desirable concentration of benzoin in the matrix is considerably smaller than the concentration of Si-Cl groups. After sensitization, it is believed, many unreacted Si-Cl groups remain. These groups have a potential for adversely affecting the following polymerization and should be removed. This is accomplished by contacting the matrix with compounds which react with the Si-Cl group but do not solvate the bound benzoin. Alcohols with preferably 2 to 6 carbon atoms are advantageously used. Pure ethanol is inappropriate because it very strongly solvates the bound benzoin. Alcohols with greater than 6 carbon atoms tend to be too viscous and not sufficiently volatile for practical use.

Any excess photosensitive compound must also be removed after sensitization without removing a substantial fraction of the sensitizer which is bound to the matrix. This is done, for example, by using a solvent for the sensitizer which is not strong enough to break a significant number of the matrix-sensitizer bonds. In the case of benzoin used in a VYCOR matrix, isopropyl alcohol is quite effective both for destroying Si-Cl groups of glass that has been treated with thionyl chloride and for solvating the excess benzoin.

3. Image Exposure

After the matrix is sensitized, a latent-image is formed by selectively destroying a portion of the photosensitive compound, the compound which later functions as the polymerization initiator. This is done by exposing the matrix to the light pattern to be recorded. During the exposure it is desirable to fill the matrix pores with a fluid. Light scattering by the pores is reduced by matching the refractive index of the filling fluid to the refractive index of the glass. Alternatively, the refractive index of the filling fluid is adjusted to match that of the monomer mixture used in the developing step. It is also possible to use the liquid to react with a photochemical by-product to prevent formation of strongly absorbing or photochemically-active species.

The source of the exposing light is not critical. Of particular interest are the interference patterns produced by two coherent beams, a reference beam and an object beam. In the holographic recordation of images such as gratings, two exposure geometries are possible. The first requires both the object and reference beam to be incident on the same side of the recording medium. In the second, the two beams are incident on opposite sides. The process of this invention is useful in either of these two configurations.

It is significant in the practice of the invention that the image-forming exposure involves a normal one-photon absorption step and results in a unimolecular decay of the photosensitive material. Thus, the latent-image recorded depends only on the total integrated exposure, and not on the absolute intensity of the exposing light or the time required to complete the exposure. Intensity and time dependence is undesirable because it limits usefulness in situations where the appropriate light intensity is not practically achievable or where a multiplicity of superimposed images is recorded sequentially.

4. Development

After exposure, the fluid filling the pores is removed by a standard technique such as evaporation under vacuum. The matrix is then filled with a monomer composition which is subsequently induced to polymerize by supplying radiant energy e.g., light, to the photosensitive compound remaining in the matrix. As discussed, the efficiency of the final recording is a function of the magnitude of the refractive index difference produced in the recording medium. Various physical properties, e.g., molecular polarizability and density of the monomers employed, influence the magnitude of the refractive index difference. The selection of a monomer composition to produce a desired refractive index difference entails the same consideration of physical properties as involved in a self-developing polymeric recording medium. Appropriate criteria for picking monomers for single component (see J. A. Jenny, *Journal Opt. Soc. Am.*, 60 (9), 1155 (1970) and E. F. Haugh, U.S. Pat. No. 3,658,526), and multicomponent (see W. J. Tomlinson et al., *Applied Optics*, 15 (2), 534 (1976) and U.S. Pat. No. 3,953,620) monomer compositions are known in the art. These same criteria are applicable for the selection of a monomer composition in the practice of the subject invention. It is also possible to add inert compounds, as in the prior art, to the monomer composition to enhance the refractive index difference obtained. (See Tomlinson, supra.)

A few caveats in the choice of a monomer composition should be emphasized. Many inert compounds act as plasticizers for the polymer formed. This can lead to unacceptable fluidity. To remedy the problem, one of the monomers used with the inert compound should be a crosslinker. The resulting crosslinked polymer provides the required rigidity. However, the use of only crosslinking monomers without an inert compound usually produces adverse results. Crosslinking reactions often produce an extremely rapid rise in viscosity which is an obstacle to the adequate diffusion of the reaction products required to produce the desired refractive index difference. Generally, crosslinkers should not be used alone as the monomer composition. Large dimensional changes in the polymer during development are also undesirable, e.g., vinyl monomers shrink significantly upon polymerization. The matrix acts as a constant-volume cavity. Dimensional changes such as shrinking can cause stresses large enough to crack the matrix. This is generally prevented by adding between 20 and 80% by volume of an inert compound to a monomer composition which undergoes such changes. Finally, neither the monomer composition nor the polymerization products should have a high absorption coefficient for the radiant energy used in the development step. The use of methacrylates in the monomer composition gives advantageous results. Use of a composition with more than one component is preferred because higher index differences are obtainable.

Once the matrix is filled with the desired monomer composition, polymerization is initiated by supplying radiant energy to the photosensitive compound. The radiant energy is selected to activate only the photosensitive initiator. For example, when benzoin is the photosensitive initiator, irradiation with the 365-nm line of a high-pressure mercury arc lamp, isolated by means of an appropriate filter or a monochromator, is useful.

Any problem associated with the interference of the light used for developing the image with the developing image itself is avoided by using a light with low spatial and temporal coherence. This is done by directing the developing light to strike the sample at a shallow angle, e.g., 50-80 degrees measured from the normal to the sample surface and by rotating the sample slowly about this normal.

The following examples are included to demonstrate the experimental procedures associated with the invention.

EXAMPLE 1

Several 1cm×1cm pieces were cut from a 1.6-mm thick sheet of polished VYCOR No. 7930 (a porous silica glass). The pieces were then throughly cleaned to remove all absorbed material. They were first boiled overnight in sufficient concentrated nitric acid (70%) to cover them. The acid was decanted and the glass was washed several times with distilled water. The glass was then boiled in distilled water for 5-10 min., the water was decanted, and the glass was again washed. This procedure of boiling in water and rinsing was repeated four times. The glass pieces were placed in a glass dish and heated in a clean oven, first at 60 degrees C. for 2 hours, and then overnight at 100-120 degrees C. The dish was placed in a dessicator to cool.

If an activated surface was desired, the glass pieces used were placed in a round bottom flask and covered with thionyl chloride. The flask was fitted with a reflux condenser and kept under a nitrogen atomsphere. After the evolution of bubbles slowed, the thionyl chloride was refluxed for 3-4 hours. (The glass pieces gradually became yellow.) The liquid was cooled and decanted. The glass pieces were removed and put in a vacuum dessicator (ca. 0.1 atm) with potassium hydroxide as a dessicant. (The glass dried and gradually lost the yellow cast.) The glass was removed after about 18 hours and was stored in a closed bottle containing anhydrous calcium sulfate.

To incorporate the photosensitive component, the stored glass pieces (either activated or unactivated) were immersed in a 1% w/v solution of benzoin in chloroform. (Reagent grade chloroform normally has about 0.75% ethanol present. This was sufficient ethanol to insure a fairly uniform distribution of photosensitive compound in the matrix.) The glass filled in about 15 min. and was left in the solution for another 15 min. The glass was then removed, rinsed quickly in ethanol, wiped and placed in a glass dish to expose as much surface as possible. The dish was kept under vacuum (ca 100 mm. Hg) for at least 5 hours to remove the chloroform. The glass was then soaked in isopropyl alcohol for at least 4 hours to remove the excess benzoin. The samples were protected from near-uv light until exposed.

EXAMPLE 2

The sensitized samples from Example 1, filled with 2-propanol, were held between glass cover plates to keep the alcohol in the matrices. The filled matrices were then exposed using the 364 nm line of an Ar+ laser and an interferometer to produce the exposing interference pattern (period of about 2 μm). The average flux at the position of the sample was ~5 mW/cm$^2$ and the exposure time was 1 to 10 minutes. After exposure the 2-propanol was removed by evaporation and the matrices were filled by immersion in one of the following monomer mixtures.

| Mixture I | Quantity (Function) |
|---|---|
| Cyclohexyl methacrylate | 2ml (low index monomer) |
| 1-Chloronaphthalene | 2ml (high index inert) |
| Ethylene glycol dimethacrylate | 0.2ml (crosslinker) |
| Mixture II | |
| Dibutyl adipate | 1.5ml (low index inert) |
| Benzyl methacrylate | 1.0ml (high index monomer) |
| Ethylene glycol dimethacrylate | 0.2ml (crosslinker) |
| Mixture III | |
| Benzyl methacrylate | 2ml (high index monomer) |
| Dimethyl suberate | 2ml (low index inert) |
| Ethylene glycol dimethacrylate | 0.2ml (crosslinker) |

The filled matrices were placed between microscope cover slips and then exposed with a beam from a 1 kW Hg-Xe arc lamp, filtered with a grating monochromator to select the 365-nm line. The exposure was 10-30 min. with a light flux of 7 mW/cm$^2$. The beam was arranged to strike the sample at an angle of about 80 degrees from the normal to the sample surface. The samples were rotated about the normal to its surface at about 1 rps during this exposure.

EXAMPLE 3

The grating holograms made by the process described in Examples 1 and 2 were studied by measuring their scattering efficiency for a collimated 633-nm wavelength beam from a He-Ne laser.

The peak-to-peak index difference and efficiencies for gratings made using the various monomer mixtures are listed in the table below.

| Mixture | Index difference | Efficiency |
|---|---|---|
| I | $1.8 \times 10^{-4}$ | 34% |
| II | $3.2 \times 10^{-4}$ | 80% |
| III | $2.3 \times 10^{-4}$ | 51% |

It should be noted however, that the final holograms of mixture II developed random scattering during the subsequent time period of about a week.

What is claimed is:

1. An article produced by the process comprising the steps of impregnating a rigid porous matrix having throughout said matrix pores in the range 10 Å to 400 Å with a photosensitive compound having a reactive group which results in chemisorption to said porous body wherein said photosensitive compound is introduced into said rigid matrix after said rigid matrix is formed and has a sufficiently strong adhesion to said rigid matrix to prevent disengagement during a subsequent development step, permits the introduction of a composition capable of interreacting with said photosensitive compound upon exposure to electromagnetic radiation into said pores, is capable of being deactivated as a photosensitizer by exposure to electromagnetic radiation, and is capable of inducing said composition to change refractive index upon further exposure to electromagnetic radiation.

2. The articles of claim 1 wherein said porous body is a porous silica glass matrix.

3. The article of claim 2 wherein said photosensitive compound has a hydroxyl functional group.

4. The article of claim 3 wherein said photosensitive compound includes benzoin.

* * * * *

UNITED STATES PATENT AND TRADEMARK OFFICE
CERTIFICATE OF CORRECTION

PATENT NO. : 4,187,111

DATED : February 5, 1980

INVENTOR(S) : Edwin A. Chandross and Walter J. Tomlinson

It is certified that error appears in the above-identified patent and that said Letters Patent are hereby corrected as shown below:

Column 1, line 15, "patern" should read --pattern--.
Column 7, line 19, "absorbed" should read --adsorbed--.
Column 8, line 32, "difference" should read --differences--;
line 62 "articles" should read --article--;

Signed and Sealed this

Twelfth Day of August 1980

[SEAL]

Attest:

SIDNEY A. DIAMOND

Attesting Officer

Commissioner of Patents and Trademarks